US007269264B2

(12) United States Patent
Gierse

(10) Patent No.: US 7,269,264 B2
(45) Date of Patent: Sep. 11, 2007

(54) METHOD FOR REPRODUCING AUDIO SIGNAL FROM AT LEAST TWO DIFFERENT SOURCES

(75) Inventor: Berthold Gierse, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 154 days.

(21) Appl. No.: 10/363,579

(22) PCT Filed: Aug. 24, 2001

(86) PCT No.: PCT/DE01/03228

§ 371 (c)(1),
(2), (4) Date: Aug. 12, 2003

(87) PCT Pub. No.: WO02/19762

PCT Pub. Date: Mar. 7, 2002

(65) Prior Publication Data

US 2004/0028245 A1 Feb. 12, 2004

(30) Foreign Application Priority Data

Sep. 1, 2000 (DE) ................................ 100 43 090

(51) Int. Cl.
*H03G 3/00* (2006.01)

(52) U.S. Cl. ...................... 381/104; 381/106; 381/107; 381/56

(58) Field of Classification Search ................ 381/104, 381/107, 108, 109, 105, 106, 56, 57
See application file for complete search history.

(56) References Cited

U.S. PATENT DOCUMENTS 4,677,389 A * 6/1987 Op de Beek et al. ....... 330/129
5,692,058 A * 11/1997 Eggers et al. ............... 381/107
6,703,940 B1 * 3/2004 Allen et al. ............ 340/825.69

* cited by examiner

*Primary Examiner*—Vivian Chin
*Assistant Examiner*—Con P. Tran
(74) *Attorney, Agent, or Firm*—Kenyon & Kenyon LLP

(57) ABSTRACT

A method for reproducing audio signals of at least two different sources, a first volume for reproducing audio signals of a first source being able to be preselected, in which, during simultaneous reproduction of the audio signals of the first and the at least second source, the reproduction of the audio signals of the at least second source occurs at a volume that is raised compared to the first volume at least by a differential volume. This allows for a comprehensible reproduction of prioritized audio signals of the second source even against the background of a continuous reproduction of audio signals of a first source.

2 Claims, 1 Drawing Sheet

METHOD FOR REPRODUCING AUDIO SIGNAL FROM AT LEAST TWO DIFFERENT SOURCES

FIELD OF THE INVENTION

The present invention relates to a method for reproducing audio signals from at least two different sources, a first volume for reproducing audio signals from a first source being selectable.

BACKGROUND INFORMATION

Conventional audio systems, for example, in the form of automobile radio units sold by the firm Blaupunkt-Werke GmbH, Hildesheim, Del., are able to reproduce audio signals from various sources, such as from a radio receiver or a compact disk player or a compact cassette player. Such audio systems may allow the reproduction of the audio signals optionally either from a first source, such as the radio receiver, or from a second source, such as the CD player or the CC player. Simultaneous reproduction of the audio signals from various sources is not provided in such units. Thus, for example, during playback of a CD or CC, in case traffic information is received by the use of the radio receiver, the CD or CC playback is interrupted, instead of it the traffic information is reproduced, and subsequently the CD or CC playback is resumed.

SUMMARY OF THE INVENTION

By contrast, the method of the present invention may provide for a simultaneous reproduction of the audio signals of a first as well as at least a second source, a good comprehensibility of the audio signals of the at least second source being achieved due to a reproduction of the audio signals from the second source at a volume raised by at least one differential volume compared to the volume of the audio signals from the first source.

Also, preselection of the differential volume may be allowed for increasing the reproduction volume of the audio signals from the second source, besides the reproduction volume for the audio signals from the first source. Thereby, the user may adapt the differential volume to his own needs and listening habits.

Another example embodiment of the method, according to the present invention, to the effect that the audio signals from the first source are reproduced at the first volume and the audio signals from the second source at the second volume, when the second volume is greater than the first volume by at least the differential volume, and that the audio signals from the second source are reproduced at the second volume, and the audio signals from the first source at a volume reduced by the differential volume compared to the second volume, when the difference between the second and the first volume is less than the differential volume, may provide that the audio signals from the second source are reproduced at a second volume found to be agreeable, but that, at the same time, there is a sufficient volume separation from the audio signals from the first source, so that the comprehensibility of the audio signals from the second source remains ensured. This may be advantageous when the audio signals from the first source are being monitored at a first, high volume. For, in this case, an increase in volume for reproducing the audio signals from the second source may be perceived as disturbing or even painful. The definition of the second volume is of help here.

Also, a preselection of the differential volume may be allowed for decreasing the reproduction volume of the audio signals from the first source, besides the reproduction volume for the audio signals from the second source. Thereby, the user may adapt the differential volume to his own needs and listening habits.

Also, the differential volume may be adjusted by a set-point value/actual value comparison. Thereby, deviations of the actual reproduction volumes of the audio signals from the first and/or the second source from the values predefined by the corresponding volume setters or the control system may be offset, so that the differential volume is constantly maintained.

DETAILED DESCRIPTION

Figure 1:
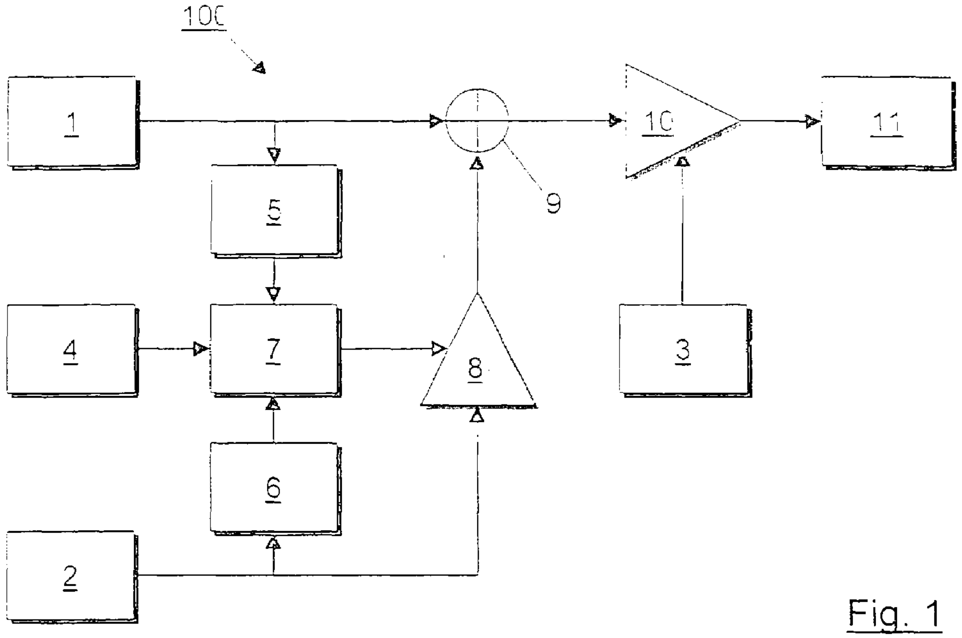
FIG. 1 shows a block diagram of a first example embodiment of a set-up according to the present invention for performing the method according to the present invention.
Figure 2:
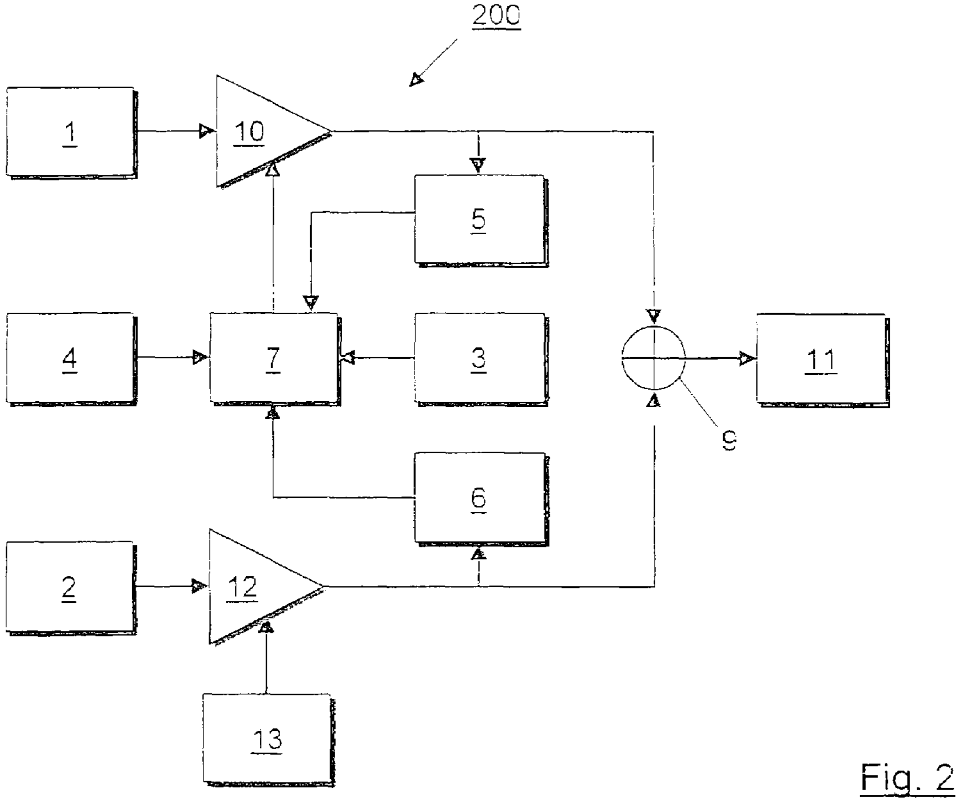
FIG. 2 shows a block diagram of a second example embodiment of a set-up according to the present invention for performing the method according to the present invention.

FIG. 1 shows a first example embodiment of an audio signal reproduction device according to the present invention for performing the method according to the present invention. In this context, for instance, an automobile radio is involved which includes a CD player or a compact cassette player and a radio receiver for receiving radio signals.

Audio signal playback device 100 includes a first audio signal source, source 1, for short. In regard to this first source 1, in the present case of the automobile radio, the CD player or the compact cassette player of the automobile radio are involved.

The audio signal of first source 1 is supplied to a controllable first amplifier 10 for amplifying the audio signal, via a mixer circuit 9, described below. The measure of the amplification of the audio signal supplied to first amplifier 10 is determined by a volume control signal, supplied to a control input of first amplifier 10, which is generated in a first volume setter 3. Thus, by the definition of the volume control signal at first volume setter 3, a first volume for the reproduction of the audio signal of first source 1 may be preselected.

The audio signal playback device also includes at least one second audio signal source, source 2, for short. With regard to this second source, in the present case of the automobile radio, for example, the radio receiver is involved, it being configured in such a manner that, during active reproduction of audio signals of first source 1, that is, CD playback or CC playback, it switches through for reproduction only specially characterized components of the received radio program, here, for example, only with the aid of a so-called traffic message identifier DK provided in the ARI (driver radio information) system or a traffic message marked TA (traffic announcement) identifier specified in the RDS (radio data system). A second source 2, thus, makes available audio signals only of short duration in the form of occasional traffic messages or warning messages.

The audio signal of second source 2 is supplied to a second input of mixer circuit 9, via a preamplifier 8 described below, in which the audio signal of second source 2 is superimposed on that of first source 1.

Thereby the superimposition (heterodyning) of the audio signals of first source 1 and second source 2 is amplified in common in first amplifier 10, and supplied to the at least one loudspeaker 11 for acoustical reproduction.

According to the present invention, audio reproduction device 100 includes a differential volume setter 4, on which a differential volume is able to be preselected, by which a reproduction of the audio signal of second source 2 compared to a volume of the audio signal of first source 1 is to be emphasized. This is based on the consideration that, against the background of a continuous reproduction of an audio signal of first source 1, that is, in the case of the automobile radio described, a CD playback or a CC playback, occasionally present audio signals of second source 2, namely, the traffic or warning messages mentioned, are to be reproduced at a volume elevated by the differential volume, so that their comprehensibility is ensured even against the background of the continuous CD playback or CC playback.

The differential volume command signal of differential volume setter 4 is supplied to a control circuit 7, which determines a control signal for controlling preamplifier 8 and for setting its amplification factor, based on the differential volume command signal and, as described below, additional influencing variables.

Besides the differential volume command signal of differential volume setter 4, a signal from a first voltage level detecting circuit 5 indicating the voltage level of the audio signal of first source 1 is also supplied to control circuit 7. First voltage level detecting circuit 5 determines from the audio signal of first source 1, supplied to it but not yet amplified, its signal level, for instance, by rectifying the audio signal and a low-pass filter connected in series to it.

In the same manner, a signal from a second voltage level detecting circuit 6, indicating the level of the audio signal of the second source is supplied to control circuit 7. Second voltage level detecting circuit 6 is configured analogously to the first voltage level detecting circuit, and, with the aid of a rectification and a low-pass filter post-connected to it, determines the level of the audio signal of second source 2, which has not yet been amplified. In the present case in which an audio signal of second source 2 appears only sporadically, it may also be provided that second voltage level detecting circuit 6 is switched to active only during the presence of an audio signal of second source 2, so that pauses in the audio signal of second source 2 do not influence the detection of the voltage level of the non-amplified audio signal of second source 2.

Control circuit 7 determines the amplification factor of preamplifier 8 in such a manner that, for a differential volume preselected to be zero at differential volume setter 4, the levels of the non-amplified audio signal of first source 1 and of the preamplified audio signal of second source 2, which are present at the two inputs of mixer circuit 9, are equal. Furthermore, control circuit 7 determines the preamplifier control signal in such a manner that, for a preselected differential volume greater than zero, the amplification of preamplifier 8 takes on a value as a result of which the audio signal of second source 2 present at the output of amplifier 10 has a volume greater by the differential volume than the amplified audio signal of first source 1 present at the output of amplifier 10.

A variant of control circuit 7 relates to a regulation of the level of the preamplified audio signal of second source 2, supplied to mixer circuit 9, based on a setpoint value/actual value comparison instead of a control. For this purpose, the audio signal of second source 2, preamplified with the aid of preamplifier 8, is supplied to second voltage level detecting circuit 6 instead of the nonamplified audio signal of second source 2. The control function of control circuit 7 for forming the preamplifier control signal should be adapted for this modification in accordance with the instructions described above.

Mixer circuit 9 is used for the superimposition of the audio signals of first source 1 and second source 2. This superimposition may occur in the sense of an addition, so that at the output of mixer circuit 9 there is a composite signal made up of the audio signals of first source 1 and second source 2 multiplied by the amplification factor of the preamplifier.

The set-up described, and thereby the method according to the present invention, which is able to be implemented by using it, for reproducing audio signals from at least two different sources, works as follows:

After preselecting or setting a first volume for the reproduction of audio signals of first source 1, that is, for instance, of the CD player or the CC player, via first volume setter 3, first amplifier 10 amplifies the audio signal of first source 1, as dictated by the set first volume, so that this signal is reproduced at the first volume over the at least one loudspeaker 11. The preselection or setting of the first volume may be made during the continuous reproduction of the audio signal of the first source using a usual volume setter 3 of the automobile radio.

Then, the differential volume is preselected at differential volume setter 4. This may be done in the factory, within the framework of a practice run of the automobile radio or via an appropriate operating device by the user, may be in an initializing mode of the unit. For this, both audio signals of the first source and of second source 2 may be reproduced, so that the setting of the differential level is able to be made in the sense of an adjustment to the listening habits of the user. If audio signals of second source 2 are not regularly available, such as in the case of traffic information received by radio, these may be simulated by substitute audio signals that are stored and supplied for the setting of the differential volume, or that are of other types.

After setting the first volume for the audio signals of first source 1 and the differential volume, the audio signals of second source 2, in case they appear, are amplified in preamplifier 8, as dictated by the preamplification signal generated in control circuit 7, in such a manner that they are reproduced via the at least one loudspeaker 11 at a volume increased by the differential volume as compared to the first volume.

In a second example embodiment of the present invention, on the other hand, it is provided that the volume for the audio signals of second source 2 shall also be predefined.

For this instance, a modified audio signal reproducing device 200 according to the present invention is configured so that the audio signals of first source 1 are supplied to a first controllable amplifier 10, while the audio signals of second source 2 are supplied to a second controllable amplifier 12. The output signals of the two amplifiers 10, 12, that is, the amplified audio signals of first source 1 and second source 2 are combined in mixer circuit 9, as was described, and are reproduced via at least one common loudspeaker 11.

The amplification of the audio signals of second source 2 by second amplifier 12 occurs as dictated by a second volume that is freely able to be predetermined by the user at a second volume setter 13.

As opposed to this, the amplification of the audio signals of first source 1 occurs using first amplifier 10 as dictated by a control signal which is generated by control circuit 7 from the differential volume signal of differential volume setter 4, the first volume preselectable at first volume setter 3, and signals indicating the levels of the audio signals of first source 1 and second source 2.

For the purpose of detecting the levels of the audio signals of first source 1 and second source 2, in turn, voltage level detecting circuits 5 and 6 are provided, which, in the second example embodiment, detect the levels of the amplified audio signals in the manner described, by rectification and subsequent low-pass filtering. This, in turn, may allow for regulation of the volume of the audio signals of second source 2, based on feedback of an actually measured audio signal level, and thus a setpoint value/actual value comparison and on a control signal appropriately generated by control system 7. Due to the simultaneous monitoring also of the volume of the audio signal of first source 1, the maintaining of the differential volume is also subject to a regulation.

In this example embodiment, control system 7 is configured in such a manner that, in the case of the simultaneous reproduction of the audio signals of first source 1 and second source 2:

the audio signals of first source 1 are reproduced at the first volume set at first volume setter 3, and the audio signals of second source 2 are reproduced at the second volume set at second volume setter 13, when the second volume is greater than the first volume by at least the differential volume, and the audio signals of the second source 2 are reproduced at the second volume set at second volume setter 13, and the audio signals of the first source 1 are reproduced at a volume reduced by the differential volume compared to the second volume, when the difference between the second and the first volume is less than the differential volume, or the first volume is greater than the second volume.

The regulation mentioned of the differential volume has the effect that, for example, when there are deviations of the amplification factor of the second amplifier 12 from the amplification factor predefined by second volume setter 13, for example, as a result of a limiting manifestation of the amplifier at high preselected values of the second volume, the actually too low second volume is detected by second voltage level detecting circuit 6, and the actual reproduction volume of the audio signals of first source 1 is correspondingly reduced. For, if the first, preselected volume lies by less than the differential volume below the second preselected volume that is set at second volume setter 13, then, as described, the actual reproduction volume for the audio signal of first source 1 is reduced to a value which is less than the second volume by the differential volume. Now, if the actual reproduction volume of the audio signals of second source 2, for reasons already explained, lies below the preselected value, then by regulation of the actual reproduction volume for the audio signal of the first source, an additional reduction is made by this missing amount in the second volume, so that the volume separation between the actual reproduction volumes of the audio signals of first source 1 and second source 2 corresponds to the differential volume.

Instead of the described example embodiment including a CD player or a CC player as first source 1 and a radio receiver, or more accurately, a traffic receiver as second source 2, other configurations of audio signal sources may be allowed, namely, for instance, a first source 1 for an entertainment program and a second source 2 in the form of a vehicle navigation device generating acoustical driving instructions, which, due to their configuration for guiding a driver along a travel route, are yielded a higher priority than is given to the entertainment program and which, therefore, in case they come to the forefront, are reproduced with prime importance, which means, in this case, louder by at least the differential volume than the entertainment program.

Additional configurations, which are furthermore not limited to vehicle audio reproduction devices, are conceivable, and lie within the scope of the present invention.

Furthermore, the audio signals of the first source and second source may be reproduced over different loudspeakers, and in the same manner to process them completely independently of one another. In addition, the actual reproduction volumes of the signals of the first and second source may be captured, using at least one microphone arranged within the emission range of the loudspeaker(s), for the purpose of level detection, expediently the signal in each case other than the one to be examined being able to be removed from the microphone signal with the aid of a suitable, perhaps adaptive filter, to which is supplied both the microphone signal and the audio signal emitted by the first source 1 and second source 2 respectively.

What is claimed is:

1. A method for reproducing audio signals from at least two different sources, the method comprising:

simultaneously reproducing audio signals of a first source and audio signals of a second source, a first volume for reproducing the audio signals of the first source being preselected, and a second volume for reproducing audio signals of the second source being preselected;

predetermining a differential volume independent of the first volume and the second volume; and wherein, during the simultaneous reproduction of the audio signals of the first source and the audio signals of the second source, the audio signals of second source are reproduced using the second volume, and one of: a) determining a difference between the second volume and the first volume, and only if the second volume is greater than the first volume by at least the predetermined differential volume, the audio signals of the first source are reproduced at the first volume; and b) if the difference between the second volume and the first volume is less than the predetermined differential volume, the audio signals of the first source are reproduced at a volume automatically reduced by the predetermined differential volume compared to the second volume.

2. The method of claim 1, wherein the differential volume is adjusted based on a setpoint value/actual value comparison.

* * * * *